United States Patent [19]
Naxera

[11] Patent Number: 4,789,842
[45] Date of Patent: Dec. 6, 1988

[54] COMPOSITE TRANSISTOR DEVICE WITH OVER-CURRENT PROTECTION

[76] Inventor: Jiri Naxera, 263 Ridge Rd., Lyndhurst, N.J. 07071

[21] Appl. No.: 124,173

[22] Filed: Nov. 23, 1987

[51] Int. Cl.$^4$ .............................................. H02H 7/20
[52] U.S. Cl. ................................. 330/298; 330/207 P
[58] Field of Search .................. 330/207 P, 298, 307, 330/310, 311

[56] References Cited
U.S. PATENT DOCUMENTS 4,321,648 3/1982 Kaplan ........................ 330/298 X
4,374,364 2/1983 Henery et al. ..................... 330/298

Primary Examiner—Eugene R. LaRoche
Assistant Examiner—Steven J. Mottola
Attorney, Agent, or Firm—Vangelis Economou

[57] ABSTRACT

A composite transistor device having over-current protection is disclosed, and particularly a device for protecting Darlington configuration power transistor devices. The over-current protection circuit operates to clamp the base-emitter potential of the exciter transistor thus causing the power output transistor to maintain a power output below a predetermined threshold value. This allows the control of the power output intensity so as to avoid damage to the circuit, and with a minimum of power losses due to active voltage losses.

11 Claims, 1 Drawing Sheet

COMPOSITE TRANSISTOR DEVICE WITH OVER-CURRENT PROTECTION

BACKGROUND OF THE INVENTION

The present invention relates to the over-current protection of transistor devices and more particularly, to the over-current protection of power transistor devices utilizing a Darlington configuration.

Many electronic devices use transistors for regulating the electric current passing through a load. Circuits having output power transistors which are directly controlled by an exciter transistor are common and are known as Darlington circuits or Darlington configurations for a power circuit. The exciter transistor controls the output power of the circuit adequately under normal conditions, but in the event that such a device becomes overloaded, or if the load is short-circuited, the electric current through the transistor continues to increase in intensity. If the intensity increases beyond a certain point, the current can even destroy the output power transistor. Thus such a circuit requires some type of over-current protection for the power output transistor.

One method utilized in the prior art which provides the necessary over-current protection has been to include a sensing resistor connected in series to the Darlington configuration of transistors. As the current in the output circuit increases, a potential develops across the resistor. This potential may then be applied to a base-emitter junction of an auxiliary transistor, where the auxiliary transistor collector electrode is connected to the base electrode of an exciter transistor in the Darlington configuration. As the potential which has developed across the sensing resistor exceeds a predetermined threshold value, the auxiliary transistor becomes biased into conduction and acts as a clamp on the base drive. Thus the exciter transistor limits the base-emitter current of the output power transistor which in turn limits the current in the output circuit as a whole.

However, the prior art over-current protection circuit as described above tends to cause a significant increase in the active voltage losses of the circuit when it operates in the switching mode or when the transistors are saturated. These losses may be on the order of 20% or more and can significantly affect the efficient operation of the output power circuit.

Another example of an over-current protection circuit known in the prior art is shown in U.S. Pat. No. 3,845,405. The circuit described by this patent provides for over-current protection for a single transistor power device. Furthermore, the devices known to the prior art all lack the advantages provided by the present invention as is described below.

SUMMARY OF THE INVENTION

The present invention discloses an over-current protection circuit having the unique features and characteristics which enable it to overcome the drawbacks in the prior art devices. In accordance with the invention, the following objects, features and advantages are provided.

One object of the present invention is to decrease the voltage losses of the output power transistor device resulting from the presence of an over-current protection circuit.

Another object of the present invention is to maintain the output current of the device under a predetermined threshold level and thus to protect the Darlington configuration from being destroyed by an excess current above the threshold level.

Another object of the present invention is to decrease the over-current protection circuit power losses of the Darlington transistor configuration when the device is in the switching mode below those possible by the prior art devices.

Still another object and a distinct advantage of the present invention over the prior art is that it provides for a lower voltage potential between the output electrodes when the device is in a switching mode.

Another advantage of the present invention is the elimination of a substantial amount of power loss which results in the operation of the prior art devices.

In accordance with these and other objects, features and advantages of the present invention, there is provided an over-current protection device and circuit clamping of the potential of an output power circuit so as to avoid damage to that circuit while also eliminating a substantial portion of the power losses associated with the over-current devices known to the prior art. The present invention describes a device and circuit which comprises a power output transistor and an exciter transistor which are in a Darlington configuration, a sensing resistor and an auxiliary transistor whereby these elements are interconnected in such a way so as to result in an over-current condition detecting means which, when the over-current condition is detected, sends an electrical signal that triggers the auxiliary transistor base-emitter potential clamping means, thus limiting the current flow through the exciter and consequently limiting the current flow through the power transistor below a predetermined threshold value.

Moreover, the power output transistor may be either of the N-P-N type conductivity or of the P-N-P conductivity, and the remainder of the circuitry may be altered to conform and correspond with the conductivity type of the power output transistor.

These and other objects, features and advantages will become apparent to those skilled in the art in light of the following detailed description of the invention when understood with particular reference to the drawing figures.

BRIEF DESCRIPTION OF THE DRAWINGS

The drawing FIGS. 1 and 2, in which like referenced characters indicate corresponding elements in the schematic diagrams, are intended to be only representative, and other embodiments of similar or equivalent devices are encompassed by the following description.

DETAILED DESCRIPTION OF THE PREFERRED EMBODIMENT

Figure 1:
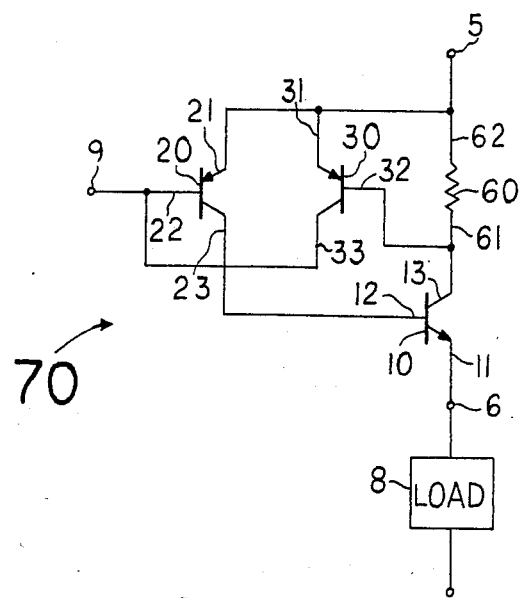
FIG. 1 is a schematic diagram representing a circuit according to the present invention and illustrates a transistor over-current protection device for a Darlington configuration.

Referring now to FIG. 1, a composite transistor device is therein represented by a circuit diagram which is generally indicated at 70. The transistor 10 is a power output transistor having an emitter electrode 11, a base electrode 12 and a collector electrode 13. Transistor 10 may in actuality be formed from a number of paralleled component transistors. Furthermore, all of the component elements herein discussed of the composite transistor device may be formed within the confines of an integrated circuit, such as on a single semiconductor die.

Transistor 20 is an exciter transistor, being of the opposite conductivity type to said power output transistor 10, and having an emitter electrode 21, a base electrode 22 and a collector electrode 23. Transistor 30 is an auxiliary transistor, being of the opposite conductivity type to said power output transistor 10, and having an emitter electrode 31, a base electrode 32 and a collector electrode 33. The resistor 60 is a sensing resistor and its resistance is chosen to be of such a value that when the collector current of the power output transistor 10 tends to exceed a predetermined intensity, the potential Vr across the sensing resistor 60 becomes large enough so as to bias the base-emitter junction of the auxiliary transistor 30 into conduction. The base electrode 12 of the power output transistor 10 and the collector electrode 23 of the exciter transistor 20 are interconnected.

The first electrode 61 of the sensing resistor 60, the collector electrode 13 of the power output transistor 10 and the base electrode 32 of the auxiliary transistor 30 are interconnected. The second electrode 62 of the sensing resistor 60, the emitter electrode 21 of the exciter transistor 20, the emitter electrode 31 of the auxiliary transistor 30 and a first output electrode 5 of the composite transistor device 70 are interconnected. The base electrode 22 of the exciter transistor 20, the collector electrode 33 of the auxiliary transistor 30 and a control input electrode 9 of the composite transistor device 70 are interconnected. The emitter electrode 11 of the power output transistor 10 also acts as a second output electrode 6 of the composite transistor device 70.

When the exciter transistor 20 is conducting in response to a potential in the control input electrode 9, its collector current flows through the base electrode 12 of the power output transistor 10, which is also in the conductive mode. The collector current of the power output transistor 10 flows through a power supply (not shown), through the sensing resistor 60, through the power output transistor 10 and through a load 8.

The collector current of the power output transistor 10 develops a potential Vr across the sensing resistor 60 in accordance with Ohm's Law. As the collector current in the power output transistor 10 remains at the commensurate intensity, the potential drop Vr across the sensing resistor 60 normally remains insufficiently large to forward bias the base-emitter junction of the auxiliary transistor 30, thus maintaining the auxiliary transistor 30 in a non-conductive condition. Moreover, as long as transistor 30 remains in the non-conductive state, its effect upon the potential of the control input electrode 9 will diminish and remain near zero.

However, in the event that the current flow through the power output transistor 10 increases, the potential drop Vr across the sensing resistor 60 will also increase. As soon as this potential drop Vr approaches or exceeds a predetermined threshold value, the value being a function of the resistance of the resistor 60, the auxiliary transistor 30 will be biased toward conduction and will consequently clamp the base-emitter potential of the exciter transistor 20. If the exciter transistor 20 is in a non-conductive state, the power output transistor will also tend to become non-conductive until its collector current decreases well below the predetermined threshold value. Furthermore, a time constant in the feedback loop can cause the oscillation of the transistor device 70, and this time constant will be dependent on the capacitance and resistance of each of the transistor electrodes and of the other elements of the device.

Figure 2:
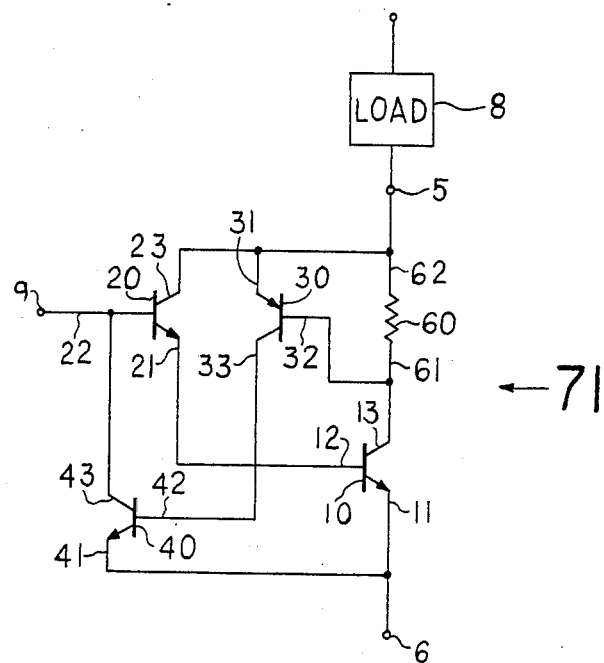
FIG. 2 is an alternative embodiment of the present invention illustrated by a schematic diagram representing a transistor circuit in the Darlington configuration and provided with an over-current protection circuit according to the present invention.

FIG. 2 illustrates another basic embodiment of the present invention. In this device, generally indicated at 71, the power output transistor 10, the auxiliary transistor 30 and the sensing resistor 60 are identical components to those of the device illustrated in FIG. 1. However, in this embodiment, the exciter transistor 20' is of the same conductivity type as that of the power output transistor 10. A further difference contained in this embodiment is the inclusion of a clamping transistor 40. Clamping transistor 40 has an emitter electrode 41, a base electrode 42 and a collector electrode 43, and it is of the same conductivity type as that of the exciter transistor 20' and of the power output transistor 10.

The first electrode 61 of the sensing resistor 60, the collector electrode 13 of the power output transistor 10 and the base electrode 32 of the auxiliary transistor 30 are interconnected. The second resistor electrode 62, the emitter electrode 31 of the auxiliary transistor 30, the collector electrode 23' of the exciter transistor 20' and the first output electrode 5 of the composite transistor device 71 are interconnected. The base electrode 12 of the power output transistor 10 and the emitter electrode 21' of the exciter transistor 20' are interconnected. The base electrode 42 of the clamping transistor 40 and the collector electrode 33 of the auxiliary transistor 30 are interconnected. The base electrode 22' of the exciter transistor 20', the collector electrode 43 of the clamping transistor 40 and the control input electrode 9 of the composite transistor device 71 are interconnected. Also the emitter electrode 41 of the clamping transistor 40, the emitter electrode 11 of the power output transistor 10 and the control output electrode 6 of the composite transistor device 71 are interconnected.

The characteristics of this arrangement are such that at power output collector current values below that of the predetermined threshold value, the potential drop Vr across the sensing resistor 60 will not be sufficiently large to forward bias the base-emitter junction of the auxiliary transistor 30, and the auxiliary transistor will be non-conductive and have no effect on the function of the composite transistor device 71. However, if the potential developed across sensing resistor 60 approaches or exceeds the predetermined threshold value, the auxiliary transistor 30 will tend to become biased into conduction and its collector current will flow through the base-emitter junction of the clamping transistor 40. The clamping transistor 40 will then clamp the base potential of the exciter transistor 20', which will also become non-conductive. This consequently will cause the collector current of the power output transistor 10 to decrease to a value well below the predetermined value.

To one skilled in the art, a number of variations upon the basic circuit set forth in FIGS. 1 and 2 and described in the above embodiments will readily suggest themselves. As an example, the power output transistor may be of the N-P-N type conductivity or of the P-N-P type. The exciter transistors 20 and 20' may be unipolar or the may have a Darlington configuration. The basic transistor devices 70 and 71 illustrated by FIGS. 1 and 2 may include other components such as resistors and capacitors in order to define the proper parameters of a feedback loop or to eliminate transistor cut-off currents.

Although the present invention has been discussed and described with primary emphasis on the preferred embodiments, it should be understood that various possible modifications can be made in the design of the device without departing from the spirit and scope of the present invention. The present embodiments are therefore to be considered in all respects as illustrative only and not restrictive, the scope of the invention indicated and defined only by the following claims.

What I claim is:

1. A composite transistor device having over-current protection comprising:
   (a) a sensing resistor having a first resistor electrode and a second resistor electrode;
   (b) a power output transistor means having an emitter electrode, a base electrode and a collector electrode;
   (c) an auxiliary transistor being of opposite conductivity type to said power output transistor means and having an emitter electrode and a base electrode for detecting an over-current condition in said composite transistor device, and having a collector electrode for providing a signal means indicative of said over-current condition;
   (d) an exciter transistor being of opposite conductivity type to that of said power output transistor means and having an emitter electrode, a base electrode and a collector electrode,
   where said collector electrode of said power output transistor means, said first resistor electrode and said base electrode of said auxiliary transistor are interconnected, and
   where said second resistor electrode, said emitter electrode of said auxiliary transistor and said emitter electrode of said exciter transistor are interconnected, and
   where said base electrode of said power output transistor means and said collector electrode of said exciter transistor are interconnected, and
   where said base electrode of said exciter transistor and said collector electrode of said auxiliary transistor are interconnected so as to clamp the base-emitter potential of said exciter transistor and whereby said device provides:
   for a detecting means for detecting said over-current condition, said over-current condition being manifested when the collector current flow of said power output transistor means flowing through said sensing resistor exceeds a predetermined value, thus triggering said signal means indicative of said over-current condition;
   for a clamping means for clamping the base-emitter potential of said exciter transistor in response to said signal means; and
   for a current flow limiting means for limiting the collector current flow of said power output transistor means to a value less than said predetermined value.

2. A complete transistor device according to claim 1 wherein the power output transistor means comprises a single power output transistor.

3. A composite transistor device according to claim 1 wherein said power output transistor means comprises a plurality of power output transistors being connected to each other in parallel.

4. A composite transistor device according to claim 1 wherein said device is formed on an integrated circuit.

5. A composite transistor device according to claim 4 wherein said integrated circuit is formed on a semiconductor die.

6. A composite transistor device having over-current protection comprising:
   (a) a sensing resistor having a first resistor electrode and a second resistor electrode;
   (b) a power output transistor means having an emitter electrode, a base electrode and a collector electrode;
   (c) an exciter transistor being of same conductivity type to said power output transistor means and having an emitter electrode, a base electrode and a collector electrode;
   (d) an auxiliary transistor being of opposite conductivity type to that of said power output transistor means and having an emitter electrode, a base electrode and a collector electrode, said auxiliary transistor being connected so that when said emitter and base electrodes detect an over-current condition in the collector current flow of said power output transistor means, characterized in the current flowing through said sensing resistor exceeding a predetermined value, said collector electrode provides for a signal means indicative of said over-current condition; and
   (e) a clamping transistor means for clamping the base-emitter potential of said exciter transistor transistor in response to said signal means indicative of said over-current condition, said clamping transistor being of the same conductivity type to said power output transistor means.

7. A composite transistor device according to claim 6 wherein said collector electrode of said power output transistor means, said first resistor electrode and said base electrode of said auxiliary transistor are interconnected, and
   where said second resistor electrode, said emitter electrode of said auxiliary transistor and said collector electrode of said exciter transistor are interconnected, and
   where said base electrode of said power output transistor means and said emitter electrode of said exciter transistor are interconnected, and
   where said collector electrode of said auxiliary transistor and said base electrode of said clamping transistor are interconnected so as to clamp the base-emitter potential of said exciter transistor and where said base electrode of said exciter transistor and said collector electrode of said clamping transistor are interconnected, and
   where said emitter electrode of said power output transistor and said emitter electrode of said clamping transistor are interconnected.

8. A composite transistor device according to claim 7 wherein said power output transistor means comprises a single power output transistor.

9. A composite transistor device according to claim 7 wherein said power output transistor means comprises a plurality of power output transistors connected to each other in parallel.

10. A composite transistor device according to claim 7 wherein said device is formed on an integrated circuit.

11. A composite transistor device according to claim 10 wherein said integrated circuit is formed on a semiconductor die.

* * * * *